United States Patent
Palmer et al.

(10) Patent No.: US 8,093,704 B2
(45) Date of Patent: Jan. 10, 2012

(54) PACKAGE ON PACKAGE USING A BUMP-LESS BUILD UP LAYER (BBUL) PACKAGE

(75) Inventors: Eric C. Palmer, Tempe, AZ (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 12/132,085

(22) Filed: Jun. 3, 2008

(65) Prior Publication Data

US 2009/0294942 A1 Dec. 3, 2009

(51) Int. Cl.
*H01L 23/02* (2006.01)

(52) U.S. Cl. .......... 257/686; 257/789; 257/E23.116

(58) Field of Classification Search .......... 257/686, 257/789, E23.116
See application file for complete search history.

(56) References Cited

U.S. PATENT DOCUMENTS

| | | | |
|---|---|---|---|
| 6,154,366 A * | 11/2000 | Ma et al. | 361/704 |
| 6,271,469 B1 | 8/2001 | Ma | |
| 6,423,570 B1 | 7/2002 | Ma | |
| 6,489,185 B1 | 12/2002 | Towle | |
| 6,555,906 B2 | 4/2003 | Towle | |
| 6,586,276 B2 | 7/2003 | Towle | |
| 6,586,822 B1 | 7/2003 | Vu | |
| 6,586,836 B1 | 7/2003 | Ma | |
| 6,617,682 B1 | 9/2003 | Ma | |
| 6,706,553 B2 | 3/2004 | Towle | |
| 6,709,898 B1 | 3/2004 | Ma et al. | |
| 6,713,859 B1 | 3/2004 | Ma | |
| 6,734,534 B1 | 5/2004 | Li | |
| 6,740,964 B2 * | 5/2004 | Sasaki | 257/687 |
| 6,794,223 B2 | 9/2004 | Ma | |

(Continued)

FOREIGN PATENT DOCUMENTS

WO 2009158098 A2 12/2009

(Continued)

OTHER PUBLICATIONS

Ma et al.; "Direct Build-Up Layer On An Encapsulated Die Package", U.S. Appl. No. 09/640,961, filed Aug. 16, 2000, 70 pages.

(Continued)

*Primary Examiner* — N Drew Richards
*Assistant Examiner* — Grant Withers
(74) *Attorney, Agent, or Firm* — David L. Guglielmi

(57) ABSTRACT

In some embodiments, package on package using a bumpless build up layer (BBUL) package is presented. In this regard, an apparatus is introduced comprising a microelectronic die having an active surface, an inactive surface parallel to said active surface, and at least one side, an encapsulation material adjacent said at least one microelectronic die side, wherein said encapsulation material includes a bottom surface substantially planar to said microelectronic die active surface and a top surface substantially planar to said microelectronic die inactive surface, a through via connection in said encapsulation material extending from said top surface to said bottom surface, a first dielectric material layer disposed on at least a portion of said microelectronic die active surface and said encapsulation material surface, a plurality of build-up layers disposed on said first dielectric material layer, and a plurality of conductive traces disposed on said first dielectric material layer and said build-up layers and in electrical contact with said microelectronic die active surface. Other embodiments are also disclosed and claimed.

10 Claims, 3 Drawing Sheets

U.S. PATENT DOCUMENTS

| | | | |
|---|---|---|---|
| 6,825,063 | B2 | 11/2004 | Vu |
| 6,841,413 | B2 | 1/2005 | Liu |
| 6,888,240 | B2 | 5/2005 | Towle |
| 6,894,399 | B2 | 5/2005 | Vu |
| 6,902,950 | B2 | 6/2005 | Ma |
| 6,921,975 | B2 * | 7/2005 | Leal et al. ............... 257/723 |
| 6,964,889 | B2 | 11/2005 | Ma |
| 7,053,475 | B2 * | 5/2006 | Akagawa ............... 257/686 |
| 7,057,290 | B2 * | 6/2006 | Sunohara et al. ......... 257/777 |
| 7,067,356 | B2 | 6/2006 | Towle |
| 7,071,024 | B2 | 7/2006 | Towle |
| 7,078,788 | B2 * | 7/2006 | Vu et al. ............... 257/668 |
| 7,183,658 | B2 | 2/2007 | Towle et al. |
| 7,189,596 | B1 | 3/2007 | Mu et al. |
| 7,279,750 | B2 * | 10/2007 | Jobetto ............... 257/347 |
| 7,285,862 | B2 * | 10/2007 | Sunohara et al. ......... 257/774 |
| 7,321,164 | B2 * | 1/2008 | Hsu ............... 257/686 |
| 7,332,823 | B2 | 2/2008 | Khaw et al. |
| 7,416,918 | B2 | 8/2008 | Ma |
| 7,420,273 | B2 | 9/2008 | Liu et al. |
| 7,514,770 | B2 * | 4/2009 | Chang et al. ............ 257/678 |
| 7,772,684 | B2 * | 8/2010 | Kuramochi et al. ....... 257/686 |
| 2002/0020898 | A1 * | 2/2002 | Vu et al. ............... 257/676 |
| 2002/0149098 | A1 * | 10/2002 | Seyama et al. ........... 257/686 |
| 2003/0157747 | A1 | 8/2003 | Chen et al. |
| 2005/0062173 | A1 * | 3/2005 | Vu et al. ............... 257/787 |
| 2005/0136640 | A1 | 6/2005 | Hu et al. |
| 2005/0269681 | A1 * | 12/2005 | Asahi et al. ............ 257/686 |
| 2006/0105500 | A1 | 5/2006 | Chang |
| 2007/0152313 | A1 * | 7/2007 | Periaman et al. ......... 257/686 |
| 2008/0029872 | A1 | 2/2008 | Hsu et al. |
| 2008/0111225 | A1 * | 5/2008 | Kim et al. ............ 257/686 |
| 2009/0072382 | A1 | 3/2009 | Guzek |
| 2009/0079064 | A1 | 3/2009 | Tang et al. |
| 2009/0127686 | A1 * | 5/2009 | Yang et al. ............ 257/686 |
| 2009/0166832 | A1 * | 7/2009 | Dunne ............... 257/680 |
| 2009/0261466 | A1 * | 10/2009 | Pagaila et al. ........... 257/686 |
| 2010/0052135 | A1 * | 3/2010 | Shim et al. ............ 257/686 |
| 2010/0200975 | A1 * | 8/2010 | Chino ............... 257/686 |

FOREIGN PATENT DOCUMENTS

| | | |
|---|---|---|
| WO | 2009158098 A3 | 2/2010 |

OTHER PUBLICATIONS

Skeete et al.; "Integrated Circuit Packages Including High Density Bump-Less Build Up Layers And A Lesser Density Core Or Coreless Substrate", U.S. Appl. No. 11/860,922, filed Sep. 25, 2007, 19 pages.

International Preliminary Report on Patentability and Written Opinion received for PCT Application No. PCT/US2009/045231, Mailed on Dec. 16, 2010, 5 pages.

International Search Report and Written Opinion received for PCT Application No. PCT/US2009/045231, Mailed on Jan. 8, 2010, 10 pages.

* cited by examiner

PACKAGE ON PACKAGE USING A BUMP-LESS BUILD UP LAYER (BBUL) PACKAGE

FIELD OF THE INVENTION

Embodiments of the present invention generally relate to the field of integrated circuit package design and, more particularly, to package on package using a bump-less build up layer (BBUL) package.

BACKGROUND OF THE INVENTION

With shrinking electronic device sizes and increasing functionality, integrated circuit device packages will need to occupy less space. One way to conserve space is to combine packages on top of packages, however this can create to a prohibitively high z-height as traditionally the top package would need to be elevated to clear the bottom package die.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
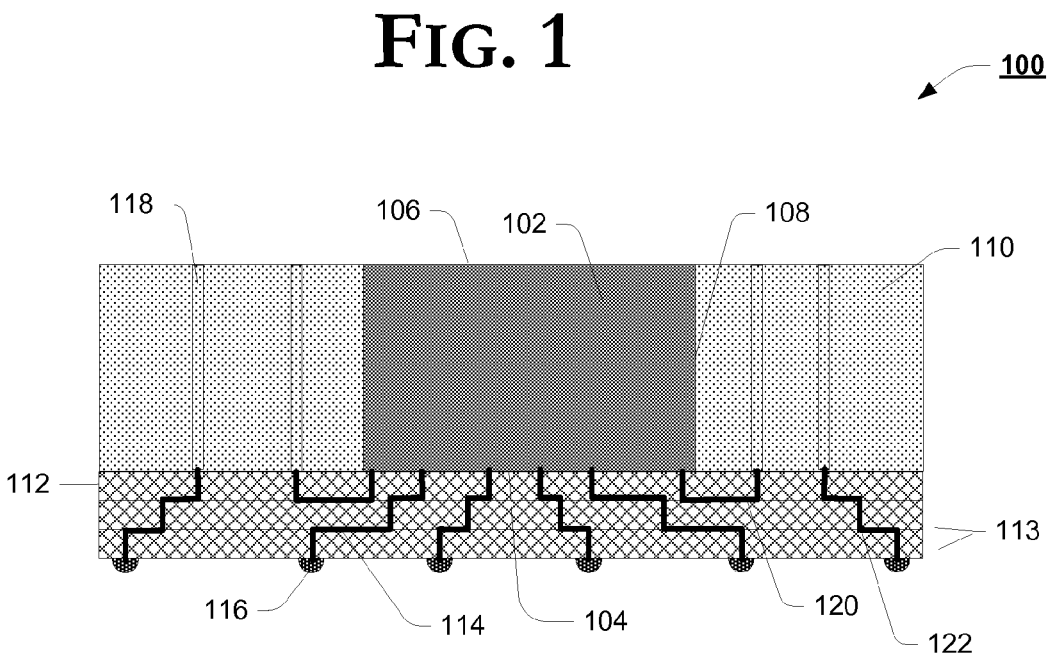
FIG. 1 is a graphical illustration of a cross-sectional view of a bump-less build up layer package, in accordance with one example embodiment of the invention.

FIG. 1 is a graphical illustration of a cross-sectional view of a bump-less build up layer (BBUL) package, in accordance with one example embodiment of the invention. As shown, integrated circuit package 100 includes one or more of microelectronic die 102, microelectronic die active surface 104, microelectronic die inactive surface 106, microelectronic die side 108, encapsulation material 110, first dielectric material layer 112, build-up layers 113, conductive traces 114, conductive contacts 116, through via connection 118, and interconnects 120 and 122.

Microelectronic die 102 is intended to represent any type of integrated circuit die. In one embodiment, microelectronic die 102 is a multi-core microprocessor. Microelectronic die 102 includes an active surface 104 which contains the electrical connections necessary to operate microelectronic die 102 and an inactive surface 106 parallel to active surface 104.

Microelectronic die 102 is held in place on at least one side 108 by encapsulation material 110. Encapsulation material 110 includes at least one surface substantially planar to active surface 104 and one surface substantially planar to inactive surface 106. In one embodiment, active surface 104 is placed on a holding plate while encapsulation material 110 is disposed around microelectronic die 102. In one embodiment, encapsulation material 110 may extend over inactive surface 106.

First dielectric material layer 112 is disposed on at least a portion of active surface 104 and encapsulation material 110. Build-up layers 113 are subsequently disposed on first dielectric material layer 112 using well known processing methods.

Conductive traces 114 are disposed on first dielectric material layer 112 and build-up layers 113 and are in electrical contact with active surface 104. Conductive contacts 116 couple with conductive traces 114 and allow integrated circuit package 100 to be electrically coupled, for example by a socket connection, to a circuit board. In one embodiment, conductive contacts 116 include solder bumps. In another embodiment, conductive contacts 116 include lands.

Through via connection 118 represents an electrically conductive connection through encapsulation material 110 substantially parallel to side 108. In one embodiment, through via connection 118 represents a plated through hole formed by drilling a hole through encapsulation material 110 that is then plated and filled. Interconnects 120 and 122 represent conductive traces to electrically couple through via connection 118 with microelectronic die active surface 104 or conductive contacts 116, respectively.

Figure 2:
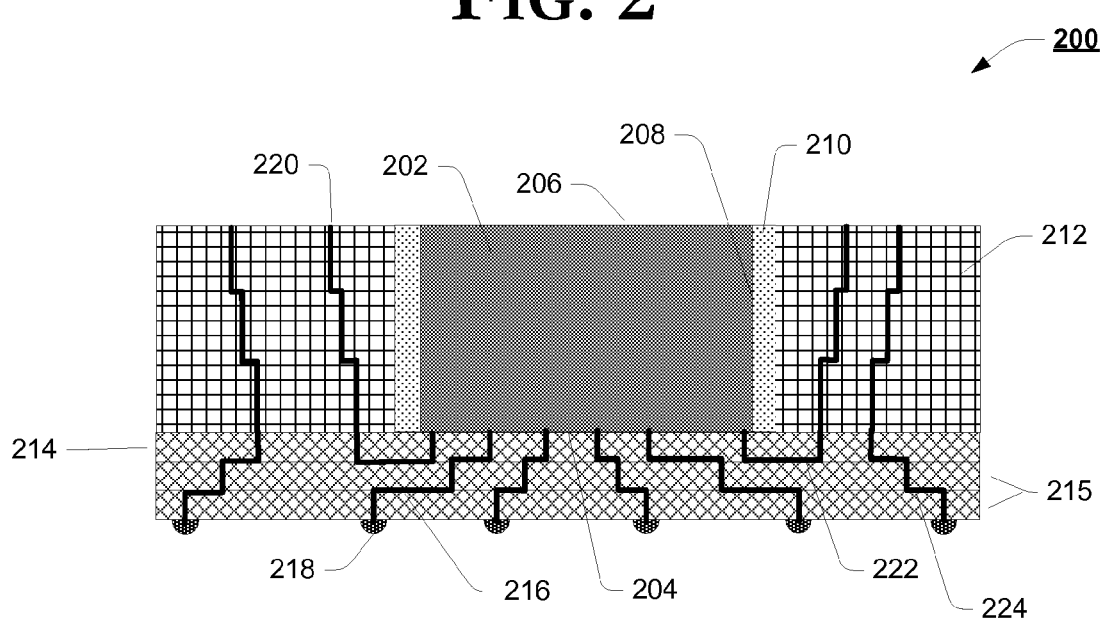
FIG. 2 is a graphical illustration of a cross-sectional view of another bump-less build up layer package, in accordance with one example embodiment of the invention.

FIG. 2 is a graphical illustration of a cross-sectional view of another bump-less build up layer package, in accordance with one example embodiment of the invention. As shown, integrated circuit package 200 includes one or more of microelectronic die 202, microelectronic die active surface 204, microelectronic die inactive surface 206, microelectronic die side 208, encapsulation material 210, package core 212, first dielectric material layer 214, build-up layers 215, conductive traces 216, conductive contacts 218, through via connection 220, and interconnects 222 and 224.

Microelectronic die 202 is intended to represent any type of integrated circuit die. In one embodiment, microelectronic die 202 is a multi-core microprocessor. Microelectronic die 202 includes an active surface 204 which contains the electrical connections necessary to operate microelectronic die 202 and an inactive surface 206 parallel to active surface 204.

Microelectronic die 202 is held in place on at least one side 208 by package core 212. Package core 212 includes at least one surface substantially planar to active surface 204 and one surface substantially planar to inactive surface 206. In one embodiment, package core 212 represents a multilayer organic substrate. Microelectronic package core 212 may have an opening in which microelectronic die 202 is disposed.

In one embodiment, encapsulation material 210 is disposed between package core 212 and microelectronic die 202 for improved fit or adhesion.

First dielectric material layer 214 is disposed on at least a portion of active surface 204 and encapsulation material 210. Build-up layers 215 are subsequently disposed on first dielectric material layer 214 using well known processing methods.

Conductive traces 216 are disposed on first dielectric material layer 214 and build-up layers 215 and are in electrical contact with active surface 204. Conductive contacts 218 couple with conductive traces 216 and allow integrated circuit package 200 to be electrically coupled, for example by a socket connection, to a circuit board. In one embodiment, conductive contacts 218 include solder bumps. In another embodiment, conductive contacts 218 include lands.

Through via connection 220 represents an electrically conductive connection through package core 212 substantially parallel to side 208. In one embodiment, through via connection 220 represents series of stacked microvias that are formed within package core 212 as part of a manufacturing process. Interconnects 222 and 224 represent conductive traces to electrically couple through via connection 220 with microelectronic die active surface 204 or conductive contacts 218, respectively.

Figure 3:
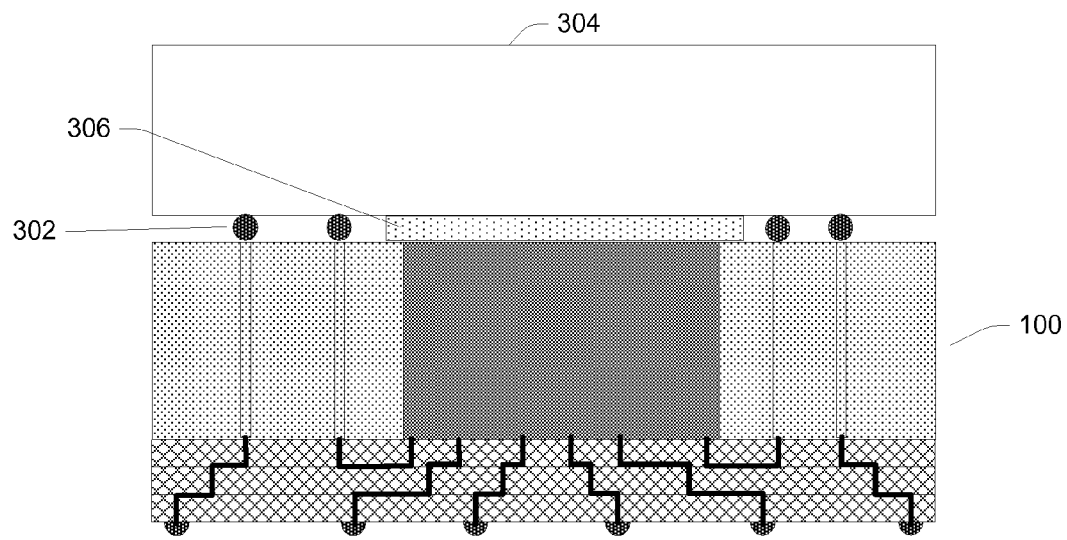
FIG. 3 is a graphical illustration of a cross-sectional view of a package on package using a bump-less build up layer package, in accordance with one example embodiment of the invention.

FIG. 3 is a graphical illustration of a cross-sectional view of a package on package using a bump-less build up layer package, in accordance with one example embodiment of the invention. As shown, package on package assembly 300 includes integrated circuit package 100 coupled with a second package 304. While shown as including two packages, any number may be included. Electrical contacts 302 coupled with through via connections 118 electrically couple second package 304 with package 100. An underfill material, such as an epoxy, may be flowed between package 100 and second package 304. Heat spreader 306 may be included between package 100 and second package 304 on inactive surface 106 to assist with heat dissipation. In one embodiment, an integrated circuit device in second package 304 includes a memory device. In one embodiment, an integrated circuit device in second package 304 includes a chipset device. In one embodiment, second package 204 represents a multi-device chip scale package. In one embodiment, second package 204 represents another bump-less build up layer package. In one embodiment, second package 204 represents a traditional flip chip package.

Figure 4:
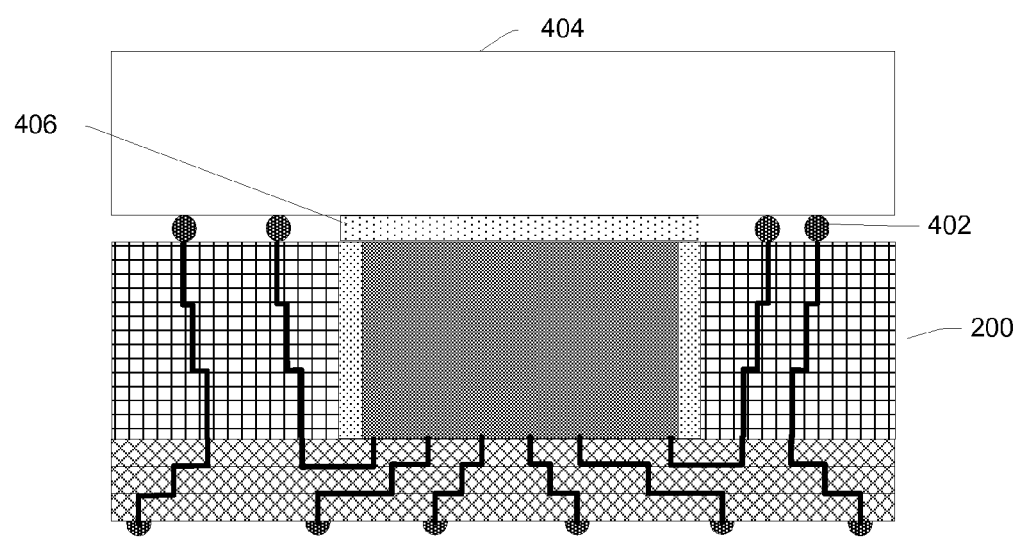
FIG. 4 is a graphical illustration of a cross-sectional view of another package on package using a bump-less build up layer package, in accordance with one example embodiment of the invention.

FIG. 4 is a graphical illustration of a cross-sectional view of another package on package using a bump-less build up layer package, in accordance with one example embodiment of the invention. As shown, package on package assembly 400 includes integrated circuit package 200 coupled with a second package 404. While shown as including two packages, any number may be included. Electrical contacts 402 coupled with through via connections 220 electrically couple second package 404 with package 200. An underfill material, such as an epoxy, may be flowed between package 200 and second package 404. Heat spreader 406 may be included between package 200 and second package 404 on inactive surface 206 to assist with heat dissipation. In one embodiment, an integrated circuit device in second package 404 includes a memory device. In one embodiment, an integrated circuit device in second package 404 includes a chipset device. In one embodiment, second package 404 represents a multi-device chip scale package. In one embodiment, second package 404 represents another bump-less build up layer package. In one embodiment, second package 404 represents a traditional flip chip package.

Figure 5:
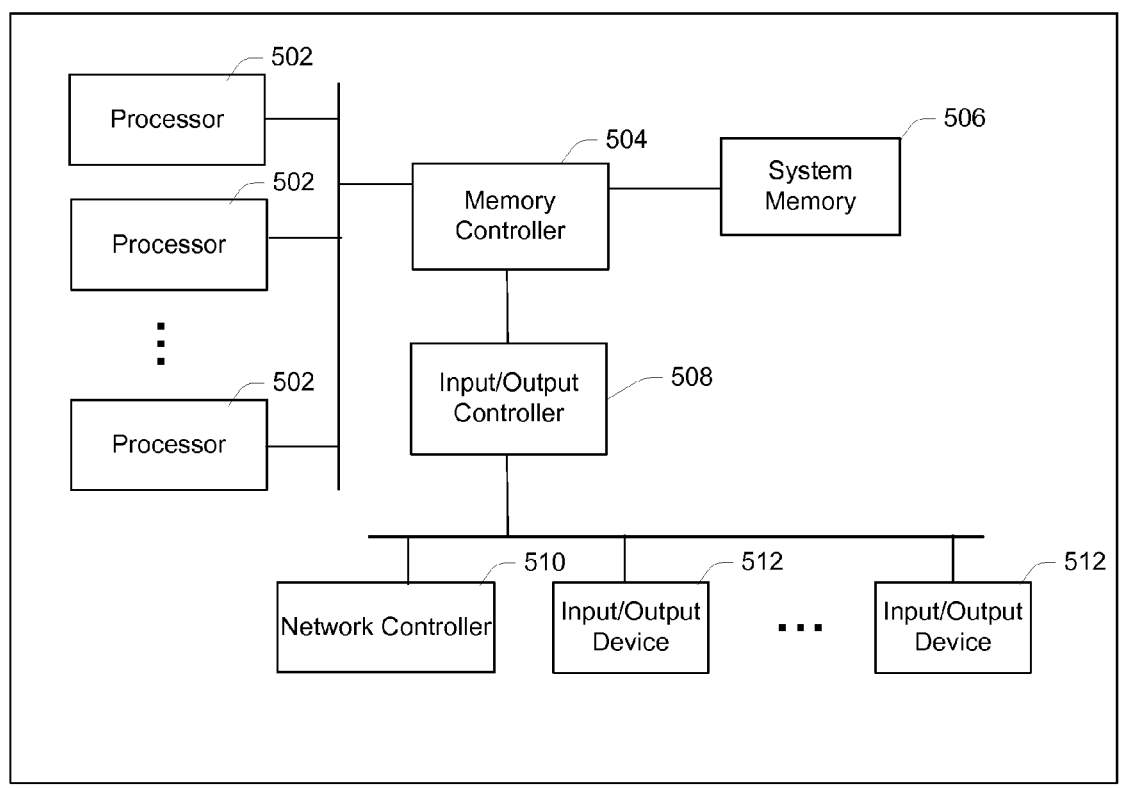
FIG. 5 is a block diagram of an example electronic appliance suitable for implementing a package on package using a BBUL package, in accordance with one example embodiment of the invention.

FIG. 5 is a block diagram of an example electronic appliance suitable for implementing an integrated circuit package, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may comprise a package on package using a BBUL package as described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 506 with the other components of electronic appliance 500. In one embodiment, the connection between processor(s) 502 and memory controller 504 may be a point-to-point serial link. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
    a microelectronic die having an active surface, an inactive surface parallel to said active surface, and at least one side;
    an encapsulation material adjacent said at least one microelectronic die side, wherein said encapsulation material includes a bottom surface substantially planar to said microelectronic die active surface and a top surface substantially planar to said microelectronic die inactive surface;
    a through via connection in said encapsulation material extending from said top surface to said bottom surface;
    a first dielectric material layer disposed on at least a portion of said microelectronic die active surface and said encapsulation material bottom surface;
    a plurality of build-up layers disposed on said first dielectric material layer;
    a plurality of conductive traces disposed on said first dielectric material layer and said build-up layers and in electrical contact with said microelectronic die active surface; and
    a second microelectronic die package on said top surface and directly electrically contacted, through a solder ball, to said through via connection in said encapsulation material.

2. The apparatus of claim 1, further comprising a heat spreader between said second microelectronic die package and said inactive surface of said microelectronic die.

3. The apparatus of claim 1, wherein said through via connection comprises a plated through hole.

4. The apparatus of claim 1, further comprising said through via connection in electrical contact with said microelectronic die active surface.

5. The apparatus of claim 1, further comprising said through via connection in electrical contact with bumps formed on said build-up layers.

6. An electronic appliance comprising:
    a network controller;
    a system memory; and
    a processor, wherein said processor comprises:
        a microelectronic die having an active surface, an inactive surface parallel to said active surface, and at least one side;
        an encapsulation material adjacent said at least one microelectronic die side, wherein said encapsulation material includes a bottom surface substantially planar to said microelectronic die active surface and a top surface substantially planar to said microelectronic die inactive surface;
        a through via connection in said encapsulation material extending from said top surface to said bottom surface;
        a first dielectric material layer disposed on at least a portion of said microelectronic die active surface and said encapsulation material bottom surface;
        a plurality of build-up layers disposed on said first dielectric material layer;
        a plurality of conductive traces disposed on said first dielectric material layer and said build-up layers and in electrical contact with said microelectronic die active surface; and
        a second microelectronic die package on said top surface and directly electrically contacted, via a solder ball, to said through via connection in said encapsulation material.

7. The electronic appliance of claim 6, wherein said second microelectronic die package comprises a memory device.

8. The electronic appliance of claim 6, wherein said second microelectronic die package comprises a chipset device.

9. The electronic appliance of claim 6, wherein said second microelectronic die package comprises a bumpless build-up layer package.

10. The electronic appliance of claim 6, wherein said second microelectronic die package comprises a chip scale package.

* * * * *